(12) United States Patent
Tezuka et al.

(10) Patent No.: US 10,665,431 B2
(45) Date of Patent: May 26, 2020

(54) PROCESSING METHOD

(71) Applicant: Tokyo Electron Limited, Tokyo (JP)

(72) Inventors: Kazuyuki Tezuka, Miyagi (JP);
Kenichi Kato, Miyagi (JP); Atsushi Sawachi, Miyagi (JP); Takamichi Kikuchi, Nirasaki (JP); Takanori Mimura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 16/003,572

(22) Filed: Jun. 8, 2018

(65) Prior Publication Data

US 2018/0294145 A1    Oct. 11, 2018

Related U.S. Application Data

(63) Continuation of application No. 13/303,392, filed on Nov. 23, 2011, now abandoned.

(Continued)

(30) Foreign Application Priority Data

Nov. 25, 2010   (JP) ................. 2010-262464

(51) Int. Cl.
   *C23C 16/455*   (2006.01)
   *H01J 37/32*    (2006.01)
   *C23C 16/509*   (2006.01)

(52) U.S. Cl.
   CPC .. *H01J 37/32449* (2013.01); *C23C 16/45561* (2013.01); *C23C 16/5096* (2013.01);
   (Continued)

(58) Field of Classification Search
   CPC ............ C23C 16/455; C23C 16/45561; C23C 16/509; C23C 16/5096; H01L 21/306; H01J 37/32
   See application file for complete search history.

(56) References Cited

U.S. PATENT DOCUMENTS 5,853,484 A   12/1998  Jeong
5,888,907 A *  3/1999  Tomoyasu .......... H01J 37/3244
                                              438/714

(Continued)

FOREIGN PATENT DOCUMENTS

JP   H04-157722 A   5/1992
JP   2002-280357 A  9/2002

(Continued)

*Primary Examiner* — Bret P Chen
(74) *Attorney, Agent, or Firm* — Pearne & Gordon LLP

(57) ABSTRACT

A method for performing a process on a target in a chamber. A gas discharge unit includes a first space having a discharge hole for discharging a first gas, a second space having a discharge hole for discharging a second gas and a third space having a discharge hole for discharging a gas generated between the first and second spaces. A distribution unit includes a first distribution pipe communicating with the first space, a second distribution pipe communicating with the second space and a third distribution pipe communicating with the third space. A valve group includes a first valve opened or closed to the first distribution pipe and a second valve opened or closed to the second distribution pipe. The method includes switching, without mixing the first gas and the second gas, the gas discharged from the discharge hole in the third space by opening or closing the valve group.

19 Claims, 9 Drawing Sheets

Related U.S. Application Data

(60) Provisional application No. 61/423,645, filed on Dec. 16, 2010.

(52) U.S. Cl.
CPC .... *H01J 37/3244* (2013.01); *H01J 37/32091* (2013.01); *H01J 37/32366* (2013.01); *H01J 37/32385* (2013.01)

(56) References Cited

U.S. PATENT DOCUMENTS

| | | | |
|---|---|---|---|
| 6,053,980 A * | 4/2000 | Suda | H01L 21/67745 |
| | | | 118/719 |
| 6,169,032 B1 | 1/2001 | Murakami et al. | |
| 6,800,139 B1 | 10/2004 | Shinriki et al. | |
| 7,592,569 B2 * | 9/2009 | Okajo | H01J 37/3244 |
| | | | 118/725 |
| 8,182,192 B2 * | 5/2012 | Hall | H01L 21/67775 |
| | | | 414/411 |
| 8,883,030 B2 * | 11/2014 | Miyagi | H01L 21/67051 |
| | | | 216/83 |
| 9,355,876 B2 * | 5/2016 | Reuter | H01L 21/6719 |
| 9,663,857 B2 * | 5/2017 | Nakano | C23C 16/45557 |
| 2003/0094903 A1 | 5/2003 | Tao et al. | |
| 2007/0071896 A1 | 3/2007 | Murphy et al. | |
| 2007/0247075 A1 | 10/2007 | Kim et al. | |
| 2007/0251918 A1 | 11/2007 | Bera et al. | |
| 2008/0132040 A1 * | 6/2008 | Wang | C23C 16/303 |
| | | | 438/478 |
| 2008/0173353 A1 * | 7/2008 | Chen | C23C 16/4402 |
| | | | 137/15.08 |
| 2009/0117746 A1 | 5/2009 | Masuda | |
| 2009/0169244 A1 * | 7/2009 | Carter | G03G 21/1633 |
| | | | 399/110 |
| 2010/0055297 A1 * | 3/2010 | Kato | C23C 16/45551 |
| | | | 427/8 |
| 2010/0119727 A1 | 5/2010 | Takagi | |
| 2010/0151131 A1 * | 6/2010 | Obara | C23C 16/4412 |
| | | | 427/255.28 |

FOREIGN PATENT DOCUMENTS

| | | |
|---|---|---|
| JP | 2006-165399 A | 6/2006 |
| JP | 2009-246263 A | 10/2009 |
| KR | 10-0385532 B1 | 8/2003 |
| KR | 10-2007-0106415 A | 11/2007 |

* cited by examiner

PROCESSING METHOD

CROSS-REFERENCE TO RELATED APPLICATION

This application claims the benefit of Japanese Patent Application No. 2010-262464 filed on Nov. 25, 2010, U.S. Provisional Application Ser. No. 61/423,645 filed on Dec. 16, 2010, and U.S. application Ser. No. 13/303,392 filed on Nov. 23, 2011, the entire disclosures of which are incorporated herein by reference.

TECHNICAL FIELD

The present disclosure relates to a processing method.

BACKGROUND

In order to improve process uniformity in a surface of a processing target object such as a semiconductor wafer, there has been proposed a method of changing a supply amount of a processing gas at a central portion and an edge portion of the wafer (see, for example, Patent Document 1).

In Patent Document 1, in order to change the supply amount of the processing gas at the central portion and the edge portion of the wafer, a circular ring-shaped partition wall is provided in a buffer room (gas diffusion space) of an upper electrode configured to discharge the processing gas. The buffer room is partitioned into a central buffer room and an outer buffer room, and the processing gas is supplied into the respective buffer rooms at different supply amounts.

Patent Document 1: Japanese Patent Laid-open Publication No. 2006-165399

In Patent Document 1, the circular ring-shaped partition wall is placed at a position capable of obtaining highest process uniformity in the surface of the wafer.

Since, however, the position of the circular ring-shaped partition wall is fixed, if there is a change in the process, e.g., a change in processing conditions, a margin for obtaining desired uniformity in the surface of the wafer would be reduced or best uniformity in the surface of the wafer may not be obtained. In such a case, a discharging position of the processing gas discharged to the central portion in the surface of the wafer and a discharging position of the processing gas discharged to the edge portion in the surface of the wafer need to be changed each time. For example, in Patent Document 1, the position of the circular ring-shaped partition wall needs to be changed or the circular ring-shaped partition wall needs to be replaced manually. Alternatively, the upper electrode itself, i.e., a processing gas discharge unit itself needs to be replaced manually.

The same problems as mentioned above may also occur when a new process is employed in order to manufacture a next-generation device as well as when there is a change in the process. For this reason, a conventional processing apparatus has low compatibility with or applicability to a next-generation device or process.

SUMMARY

Illustrative embodiments are conceived to solve the above-described problems. In an illustrative embodiment, there is provided a processing apparatus capable of changing at least one of a supply amount and a kind of a processing gas discharged to a processing target object depending on a position in a surface of the processing target object. Further, the processing apparatus is capable of changing a discharging position of the processing gas without changing a position of a circular ring-shaped partition wall manually or replacing the circular ring-shaped partition wall, or a processing gas discharge unit itself manually.

In accordance with an aspect of an illustrative embodiment, there is provided a processing apparatus capable of changing at least one of a supply amount and a kind of a processing gas that is discharged to a processing target object depending on a position in a surface of the processing target object. The processing apparatus includes a processing chamber for performing therein a process on the processing target object by using the processing gas; a mounting table provided within the processing chamber, for mounting thereon the processing target object; a processing gas discharge unit provided within the processing chamber so as to face the mounting table and configured to discharge the processing gas into the processing chamber; a space group that is provided within the processing gas discharge unit and partitioned by partition walls, and that includes a first space corresponding to a central portion in the surface of the processing target object, a second space corresponding to an edge portion in the surface of the processing target object and at least one third space between the first space and the second space, the first to the third spaces being provided with discharge holes through which the processing gas is discharged; and a processing gas distribution unit. The processing gas distribution unit includes a processing gas distribution pipe group that includes processing gas distribution pipes communicating with the first space, the second space and the at least one third space. The processing gas distribution unit further includes a valve group that includes valves opened or closed to allow adjacent processing gas distribution pipes to communicate with each other or be isolated from each other.

In accordance with the illustrative embodiment, it is possible to provide the processing apparatus capable of changing at least one of the supply amount and the kind of the processing gas discharged to the processing target object depending on the position in the surface of the processing target object. Further, the processing apparatus is capable of changing the discharging position of the processing gas without changing the position of the circular ring-shaped partition wall manually or replacing the circular ring-shaped partition wall or the processing gas discharge unit itself manually.

DETAILED DESCRIPTION

Figure 1:
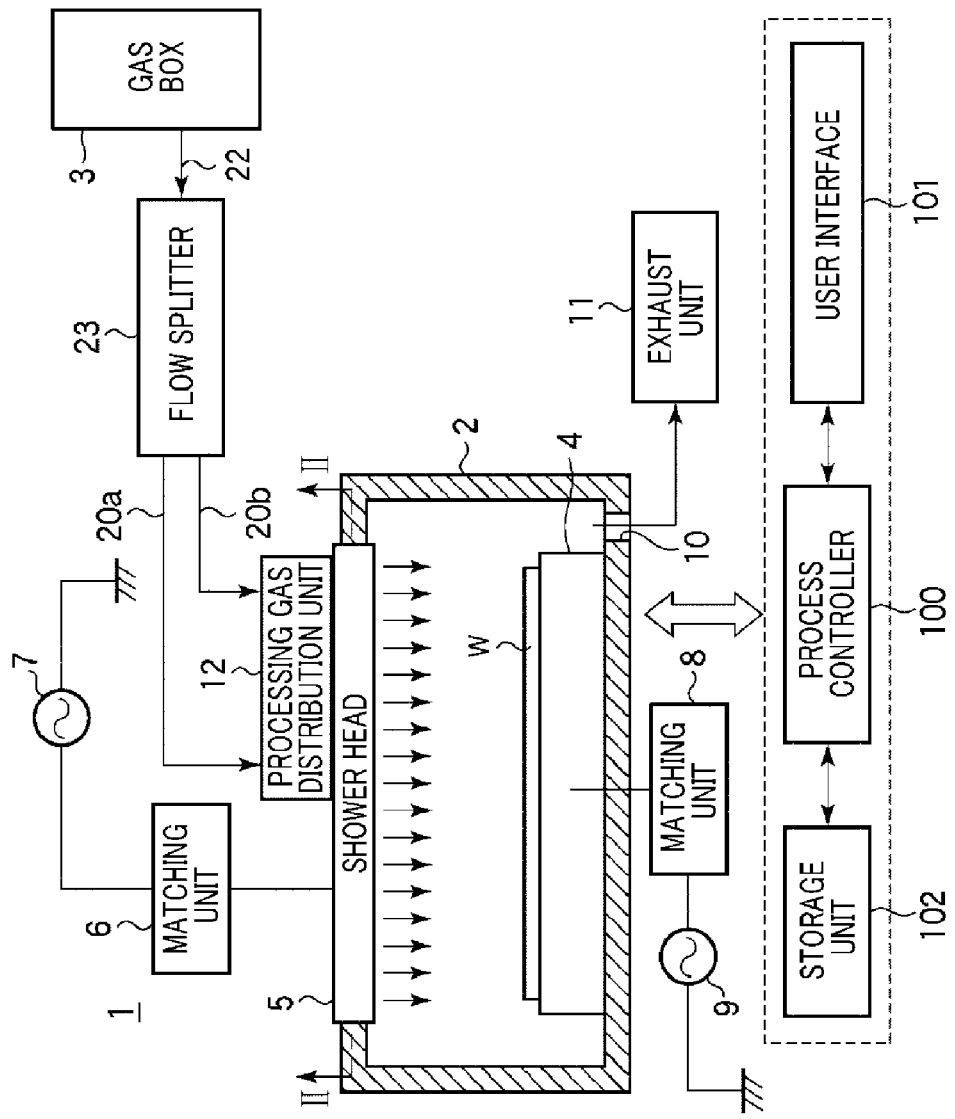
FIG. 1 is a cross sectional view schematically illustrating an example processing apparatus in accordance with an illustrative embodiment.

Hereinafter, illustrative embodiments will be described with reference to the accompanying drawings. Through the drawings, same reference numerals designate same parts.

FIG. 1 is a cross sectional view schematically illustrating an example processing apparatus in accordance with an illustrative embodiment. As an example processing apparatus in accordance with the illustrative embodiment, FIG. 1 shows a plasma processing apparatus for performing an etching process or a film forming process on a semiconductor wafer.

As depicted in FIG. 1, a parallel plate type plasma processing apparatus 1 will be explained as the processing apparatus. The plasma processing apparatus 1 includes a processing chamber 2 for performing therein a process on a processing target object such as a semiconductor wafer by using a processing gas; and a gas box 3 serving as a processing gas supply source for supplying the processing gas into the processing chamber 2.

Provided within the processing chamber 2 are a mounting table 4 for mounting thereon the wafer W; and a shower head 5 serving as a processing gas discharge unit for discharging the processing gas into the processing chamber 2. The shower head 5 serves as an upper electrode of the parallel plate, and a first high frequency power supply 7 is connected with the shower head 5 via a matching unit 6. The first high frequency power supply 7 outputs a high frequency voltage equal to or higher than, e.g., about 40 MHz, e.g., about 60 MHz. Meanwhile, the mounting table 4 serves as a lower electrode of the parallel plate, and a second high frequency power supply 9 is connected with the mounting table 4 via a matching unit 8. The second high frequency power supply 9 outputs a high frequency voltage in the range of, e.g., about 2 MHz to about 20 MHz, e.g., about 13.56 MHz.

Further, the processing chamber 2 is connected with an exhaust unit 11 through an exhaust port 10. The processing chamber 2 serves as a vacuum vessel of which the inside can be evacuated to a desired vacuum level. The exhaust unit 11 depressurizes the inside of the processing chamber 2 as the vacuum vessel to a desired vacuum level.

The plasma processing apparatus 1 is controlled by a process controller 100 such as a microprocessor (computer). The process controller 100 is connected with a user interface 101 and a storage unit 102. The user interface 101 includes a keyboard through which an operator inputs commands to manage the plasma processing apparatus 1 or a display for visually displaying an operational status of the plasma processing apparatus 1. The storage unit 102 stores therein a control program for implementing various processes to be performed by the plasma processing apparatus 1 under the control of the process controller 100; or a program, i.e., a recipe, for performing a preset process in each unit of the plasma processing apparatus 1 according to processing conditions. The recipe is stored in a storage medium in the storage unit 102. The storage medium may be a hard disk or a semiconductor memory, or may be a portable device such as a CD-ROM, a DVD or a flash memory. Otherwise, the recipe may be received appropriately from another apparatus via, for example, a dedicated line. If necessary, a recipe is read out from the storage unit 102 in response to an instruction from the user interface 101 and a process according to the retrieved recipe is executed by the process controller 100, so that a desired process is performed by the plasma processing apparatus 1 under the control of the process controller 100.

Further, the plasma processing apparatus 1 in accordance with the illustrative embodiment includes, for example, a processing gas distribution unit 12 provided on the shower head 5.

Figure 2:
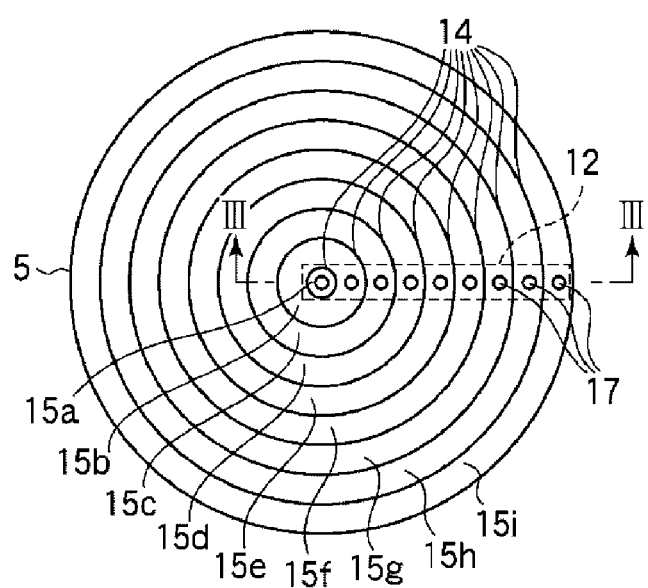
FIG. 2 is a cross sectional view taken along a line II-II of FIG. 1.
Figure 3:
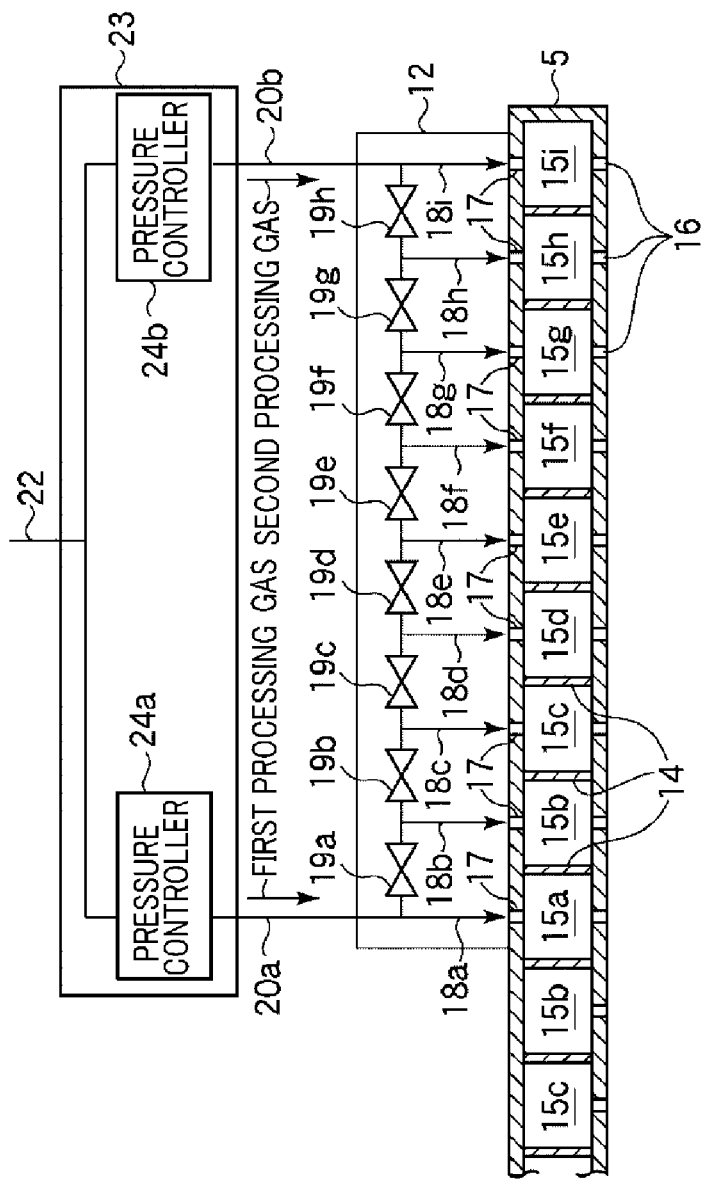
FIG. 3 is a cross sectional view taken along a line III-Ill of FIG. 2.

FIG. 2 is a cross sectional view taken along a line II-II of FIG. 1, and FIG. 3 is a cross sectional view taken along a line III-Ill of FIG. 2.

As illustrated in FIGS. 2 and 3, within the shower head 5, there is provided a space group including at least three spaces separated from each other by plural partition walls 14. In the illustrative embodiment, the shower head 5 has a circular disk shape and has therein nine spaces 15a to 15i in a concentric pattern. At the spaces 15a to 15i, there are formed a multiple number of discharge holes 16 through which the processing gas is discharged. The space 15a is a space corresponding to a central portion in a surface of the wafer W, and the spaces 15b to 15h are provided in sequence toward an edge portion of the wafer W. The space 15i is a space corresponding to the edge portion of the wafer W. The spaces 15a to 15i are connected with the processing gas distribution unit 12.

The processing gas distribution unit 12 includes a processing gas distribution pipe group and a valve group. The processing gas distribution pipe group includes processing gas distribution pipes 18a to 18i connected with the spaces 15a to 15i through connection holes 17, respectively. The valve group includes valves 19a to 19h provided between adjacent processing gas distribution pipes 18a to 18i, respectively, and the adjacent processing gas distribution pipes 18a to 18i communicate with each other or be isolated from each other by opening or closing each of the valves 19a to 19h.

If all the valves 19a to 19h are opened, all of the spaces 15a to 15i communicate with each other through the processing gas distribution pipes 18a to 18i. Meanwhile, if one of the valves 19a to 19h is closed, the spaces 15a to 15i are divided into two spaces by the closed valve.

Figure 4A:
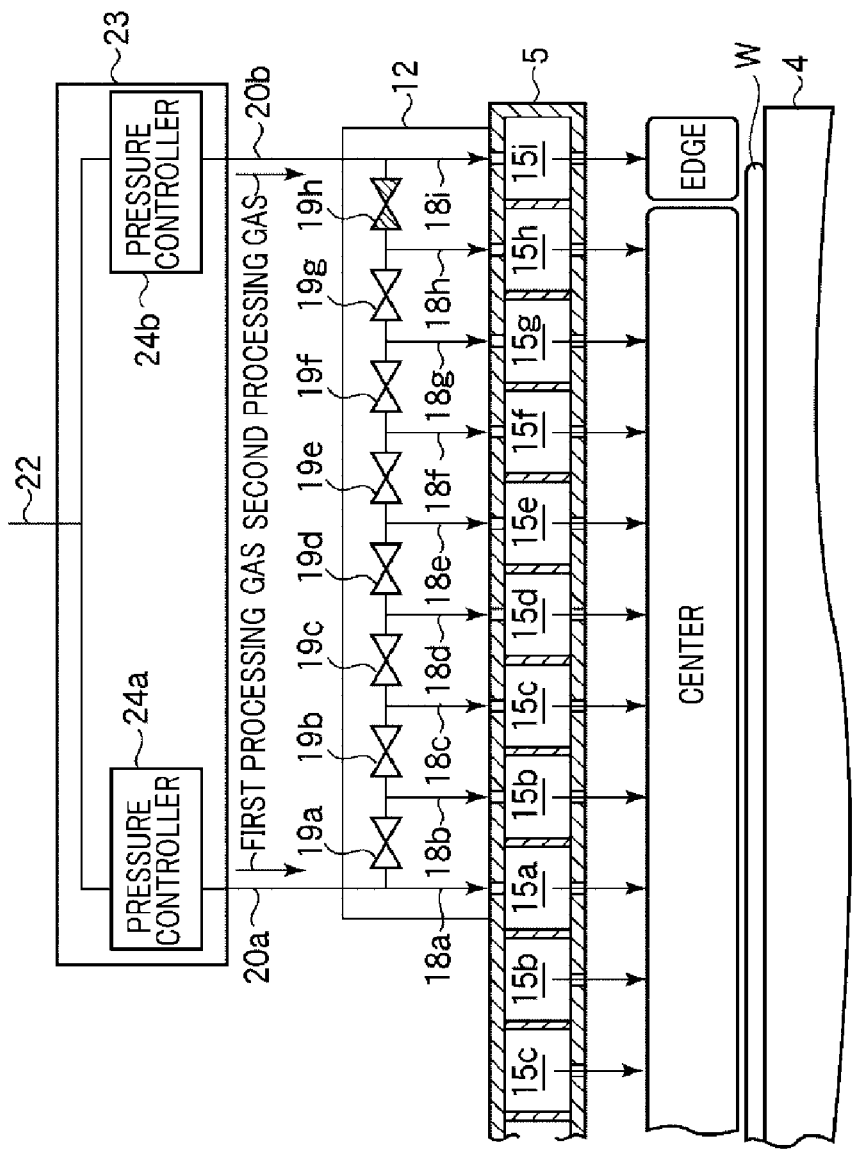
FIGS. 4A to 4C are cross sectional views for describing a relationship between a closed valve and a discharging position of a processing gas.
Figure 4B:
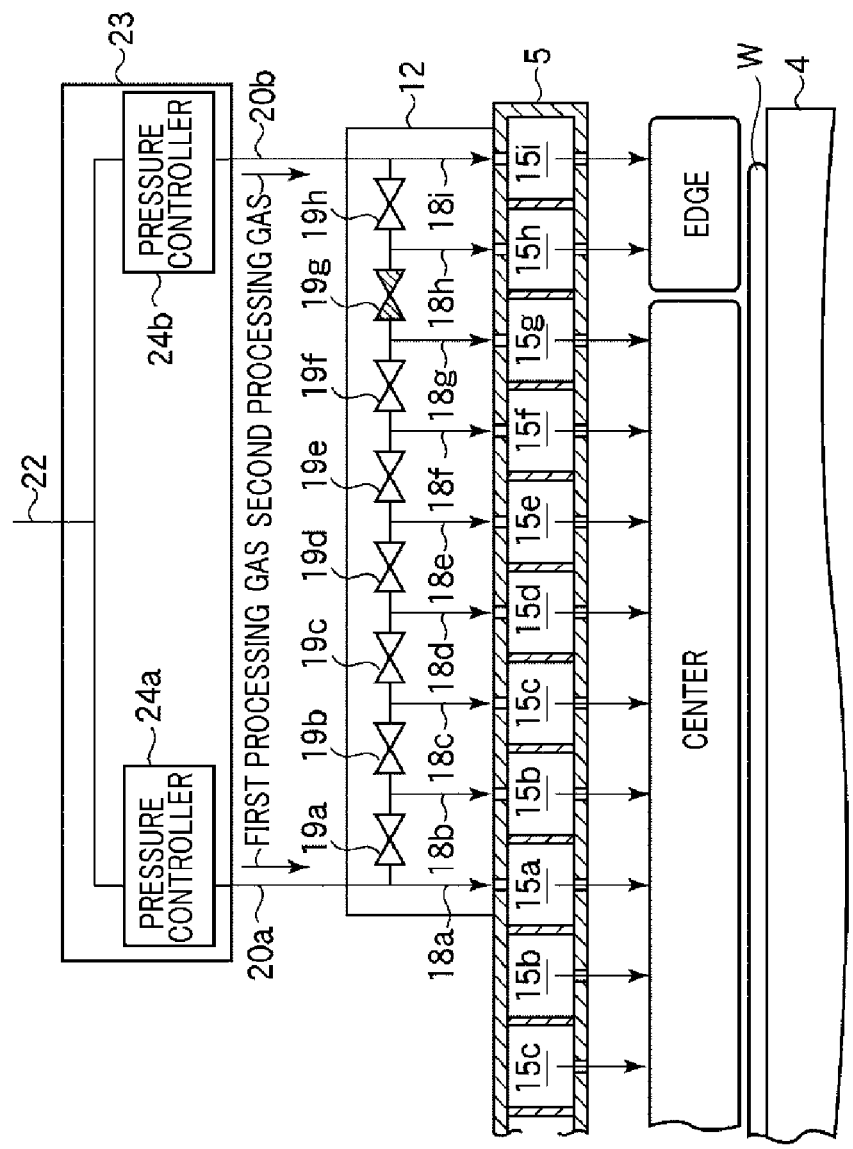
Figure 4C:
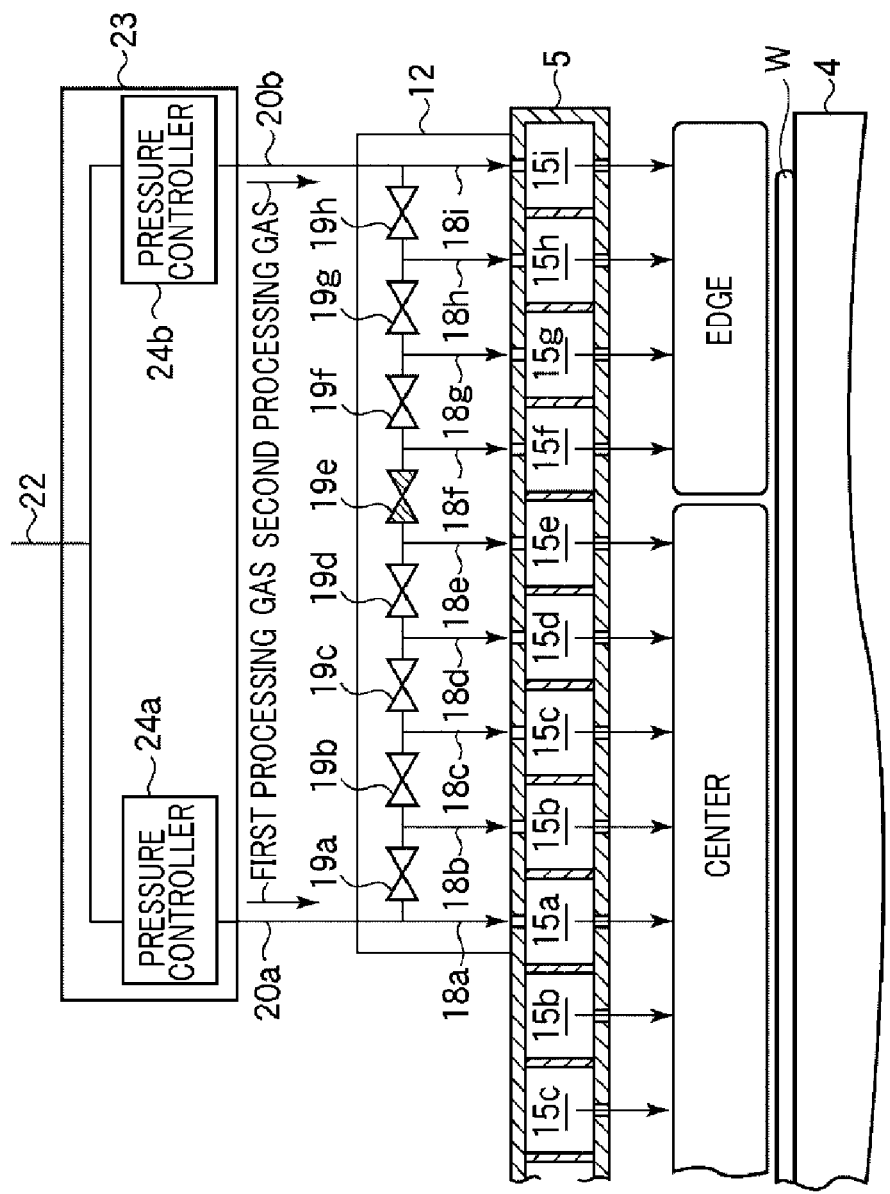

By way of example, if the valve 19h positioned at an outermost edge portion is closed, the space group is divided into a space including the spaces 15a to 15h and a space including the space 15i (FIG. 4A). If the valve 19g next to the valve 19h in sequence from the edge portion is closed, the space group is divided into a space including the spaces 15a to 15g and a space including the spaces 15h and 15i (FIG. 4B). Likewise, if the valve 19e next to the valve 19f in sequence from the edge portion is closed, the space group is divided into a space including the spaces 15a to 15e and a space including the spaces 15f to 15i (FIG. 4C).

Further, although not illustrated, if two of the valves 19a to 19h are closed, the spaces 15a to 15i are divided into three spaces by the closed two valves. Moreover, if three of the valves 19a to 19h are closed, the spaces 15a to 15i are divided into four spaces by the three closed valves.

As stated above, the plasma processing apparatus 1 in accordance with the illustrative embodiment has the processing gas distribution unit 12, and the processing gas distribution unit 12 includes the processing gas distribution pipes 18a to 18i connected with the spaces 15a to 15i, respectively; and the valves 19a to 19h opened or closed to allow the adjacent processing gas distribution pipes 18a to 18i to communicate with each other or isolated from each other.

In the plasma processing apparatus 1 using the processing gas distribution unit 12 having the above-described configuration, a discharging position of a first processing gas discharged to the central portion in the surface of the wafer W can be varied to at least two positions, and a discharging position of a second processing gas discharged to the edge portion in the surface of the wafer W can also be varied to at least two positions by opening or closing the valves 19a to 19h.

By way of example, the opening or closing of the valves 19a to 19h are controlled by the process controller 100. In this way, the discharging position of the processing gas can be easily changed.

As described above, by controlling the valves 19a to 19h to be opened or closed through the process controller 100, the valves 19a to 19h can be controlled to be opened and closed even in the middle of a process. If the valves 19a to 19h are controlled to be opened or closed during the process, at least one of a supply amount and a kind of the processing gas discharged to the wafer W can be varied depending on a position in the surface of the wafer W during the process. Accordingly, as compared to a processing apparatus incapable of changing the discharging position of the processing gas during the process, higher process uniformity in the surface of the wafer can be achieved.

By way of example, the first processing gas and the second processing gas may be different in their supply amounts.

In the plasma processing apparatus 1 in accordance with the above-described illustrative embodiment, the supply amount of the processing gas to be discharged to the wafer W can be controlled to be different at the central portion and the edge portion in the surface of the wafer W. Accordingly, as illustrated in FIG. 3 and FIGS. 4A to 4C, a first processing gas main supply pipe 20a for flowing the first processing gas therethrough is connected to the processing gas distribution pipe 18a communicating with the space 15a corresponding to the central portion in the surface of the wafer W. Further, a second processing gas main supply pipe 20b for flowing the second processing gas therethrough is connected to the processing gas distribution pipe 18i communicating with the space 15i corresponding to the edge portion in the surface of the wafer W.

The processing gas is supplied into the first and second processing gas main supply pipes 20a and 20b from the gas box 3 serving as the processing gas supply source via a gas supply pipe 22 and a gas distributor, for example, a flow splitter 23 in this embodiment.

The flow splitter 23 has therein pressure controllers 24a and 24b such as mass flow controllers, serving as supply amount control devices, for adjusting supply amounts of the processing gases in the first and second processing gas main supply pipes 20a and 20b. A flow rate, i.e., a supply amount of the processing gas supplied from the gas supply pipe 22 is controlled by the pressure controllers 24a and 24b to be optimized for the central portion and the edge portion of the wafer W. Then, the processing gas is supplied into the first and second processing gas main supply pipes 20a and 20b at different flow rates as the first and second processing gases, respectively. Accordingly, the plasma processing apparatus 1 is capable of setting the supply amount of the processing gas toward the wafer W to be different at the central portion and the edge portion in the surface of the wafer W.

Meanwhile, different kinds of gases may be used as the first and second processing gases. In the illustrative embodiment, the different kinds of gases imply not only gases having different contents but also gases having different concentrations.

When different kinds of gases are used, the first and second processing gases of different kinds are supplied from the gas box 3 into the first and second processing gas main supply pipes 20a and 20b, respectively.

In the plasma processing apparatus 1, by way of example, when there is a change in the process, i.e., a change in processing conditions or when a new process is employed in order to manufacture a next-generation device, by selecting a valve to be closed among the valves 19a to 19h, the discharging position of the first processing gas and the discharging position of the second processing gas can be varied.

In accordance with the plasma processing apparatus 1 of the above-described illustrative embodiment, it is possible to vary the discharging position of the processing gas without changing a position of the circular ring-shaped partition wall or replacing the circular ring-shaped partition wall, or the processing gas discharge unit itself manually.

Further, as compared to a conventional plasma processing apparatus, the plasma processing apparatus 1 in accordance with the illustrative embodiment is advantageous in that it has high compatibility with or applicability to a next-generation device or process.

Modification Example

Figure 5A:
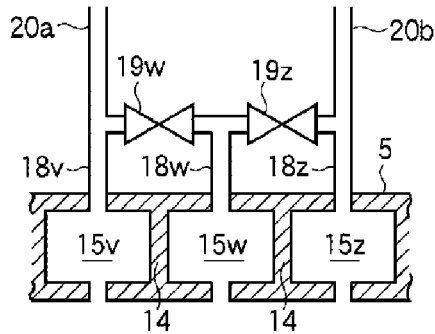
FIGS. 5A to 5C are diagrams illustrating a basic structure for switching a processing gas discharging position.

FIG. 5A shows a basic structure for changing a discharging position of a processing gas in the plasma processing apparatus 1 in accordance with the illustrative embodiment.

As depicted to FIG. 5A, the basic structure for changing the discharging position of the processing gas in the plasma processing apparatus 1 includes the following configurations (1) and (2).

(1) A space group is provided within the processing gas discharge unit 5. The space group includes a first space 15v corresponding to the central portion in the surface of the wafer W; a second space 15z corresponding to the edge portion in the surface of the wafer W; and at least one third space 15w between the first space 15v and the second space 15z. The spaces 15v to 15z are isolated by partition walls 14.

(2) A processing gas distribution unit is provided. The processing gas distribution unit includes a processing gas distribution pipe group and a valve group. The processing gas distribution pipe group includes processing gas distribution pipes 18v, 18w and 18z communicating with the first space 15v, the at least one third space 15w and the second space 15z, respectively. The valve group includes valves 19w and 19z opened or closed to allow the adjacent processing gas distribution pipes 18v to 18z to communicate with each other or be isolated from each other.

With this configuration, the at least one third space 15w can be switched to a space corresponding to the central portion of the wafer or a space corresponding to the edge portion of the wafer by opening or closing the valves 19w and 19z.

A specific example of changing discharging positions of two processing gases, e.g., a discharging position of a first processing gas discharged to the central portion of the wafer and a discharging position of a second processing gas discharged to the edge portion of the wafer in the above-described basic structure will be explained.

A first processing gas main supply pipe 20a for flowing a first processing gas therethrough is connected to the first processing gas distribution pipe 18v communicating with the first space 15v. Further, a second processing gas main supply pipe 20b for flowing a second processing gas therethrough is connected to the second processing gas distribution pipe 18z communicating with the second space 15z.

Figure 5B:
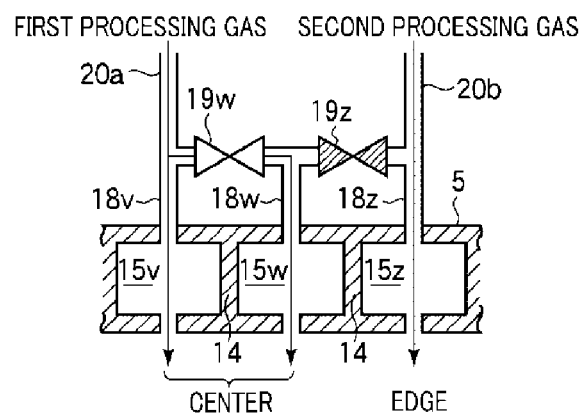

In this configuration, when the valve 19z positioned at the edge portion from the third space 15w is closed, as illustrated in FIG. 5B, the first processing gas is supplied into the third space 15w from the first processing gas main supply pipe 20a through the processing gas distribution pipe 18w and the valve 19w at the central portion. The first processing gas is then discharged from the first space 15v and the third space 15w toward the central portion in the surface of the wafer W (not shown). The second processing gas is discharged from the second space 15z toward the edge portion in the surface of the wafer W.

Figure 5C:
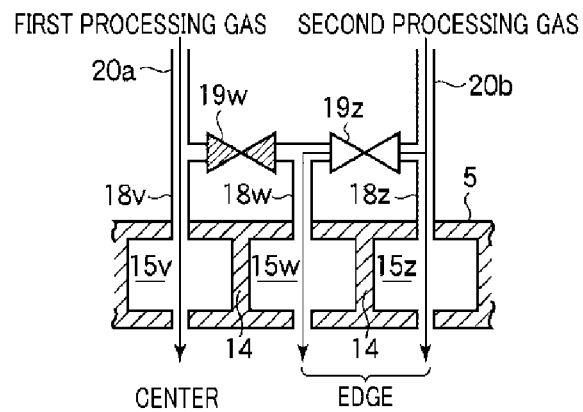

On the contrary, when the valve 19w positioned at the central portion from the third space 15w is closed, as illustrated in FIG. 5C, the second processing gas is supplied into the third space 15w from the second processing gas main supply pipe 20b through the processing gas distribution pipe 18w and the valve 19z at the edge portion. The first processing gas is discharged from the first space 15v toward the central portion in the surface of the wafer W. The second processing gas is discharged from the second space 15z and the third space 15w toward the edge portion in the surface of the wafer W.

If this basic structure is provided in the plasma processing apparatus 1 in multiple numbers, the plasma processing apparatus 1 in accordance with the illustrative embodiment can be modified to be capable of changing discharging positions of three or more kinds of processing gases.

Figure 6A:
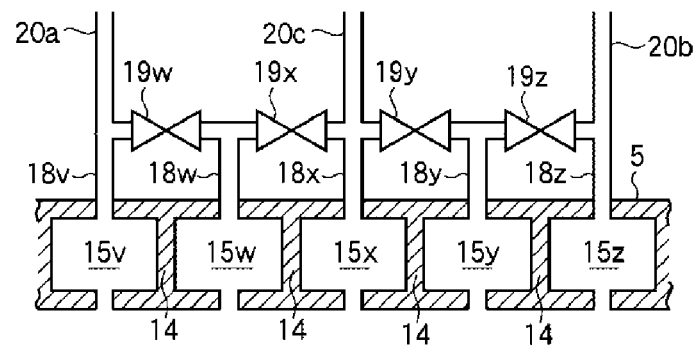
FIGS. 6A to 6E are diagrams illustrating a basic structure of a processing apparatus in accordance with a modification example

FIG. 6A is a diagram illustrating a modification example of the plasma processing apparatus in accordance with the illustrative embodiment.

As depicted in FIG. 6A, the modification example is different from the aforementioned illustrative embodiment in the following configurations (1) to (3).

(1) A space group is provided within the processing gas discharge unit 5. The space group includes a first space 15v corresponding to the central portion in the surface of the wafer W; a second space 15z corresponding to the edge portion in the surface of the wafer W; and at least three third spaces 15w, 15x and 15y between the first space 15v and the second space 15z. The spaces 15v to 15z are isolated by partition walls 14.

(2) A processing gas distribution unit is provided. The processing gas distribution unit includes a processing gas distribution pipe group and a valve group. The processing gas distribution pipe group includes processing gas distribution pipes 18v to 18z communicating with the first space 15v, the at least three third spaces 15w to 15y and the second space 15z, respectively. The valve group includes valves 19w to 19z opened or closed to allow the adjacent processing gas distribution pipes 18v to 18z to communicate with each other or be isolated from each other.

(3) A first processing gas main supply pipe 20a for flowing a first processing gas therethrough is connected to the first processing gas distribution pipe 18v communicating with the first space 15v. Further, a second processing gas main supply pipe 20b for flowing a second processing gas therethrough is connected to the second processing gas distribution pipe 18z communicating with the second space 15z. Furthermore, at least one third processing gas main supply pipe 20c for flowing a third processing gas therethrough is connected to at least one of the third spaces 15w to 15y.

The third processing gas is discharged toward a middle portion in the surface of the wafer W, and is different from the first and second processing gases in at least one of a supply amount and a gas kind. Here, the middle portion refers to at least one area in the surface of the wafer located between the central portion and the edge portion thereof.

Further, in the modification example, the at least one third processing gas main supply pipe 20c is connected to at least one of the third processing gas distribution pipe, e.g., the third processing gas distribution pipe 18x in FIG. 6A. Here, at least two valves are provided between the first processing gas main supply pipe 20a and the third processing gas main supply pipe 20c. Further, at least two valves are provided between the second processing gas main supply pipe 20b and the third processing gas main supply pipe 20c. The space 15x communicating with the third processing gas main supply pipe 20c corresponds to at least one middle portion in the surface of the wafer W.

In this way, the at least one third processing gas main supply pipe 20c communicates with the third processing gas distribution pipe via at least two valves between the third processing gas main supply pipe 20c and the first processing gas main supply pipe 20a and via at least two valves between the third processing gas main supply pipe 20c and the second processing gas main supply pipe 20b. As a result, at least one space 15w between the first processing gas main supply pipe 20a and the third processing gas main supply pipe 20c can be switched to a space corresponding to the central portion of the wafer or a space corresponding to the middle portion of the wafer by opening or closing the valves 19w and 19x. Likewise, at least one space 15y between the second processing gas main supply pipe 20b and the third processing gas main supply pipe 20c can also be switched to a space corresponding to the edge portion of the wafer or a space corresponding to the middle portion of the wafer by opening or closing the valves 19y and 19z.

Such communication methods may be performed as required. By way of example, in order to fix a space corresponding to the central portion when viewed from the middle portion, the third processing gas main supply pipe 20c may communicate with the third processing gas distribution pipe via one valve between the first processing gas main supply pipe 20a and the third processing gas main supply pipe 20c. In such a case, no space exists between the first processing gas main supply pipe 20a and the third processing gas main supply pipe 20c. Here, if the one valve is constantly kept closed, it is possible to fix the space corresponding to the central portion when viewed from the middle portion. Likewise, it is also possible to fix a space corresponding to the edge portion when viewed from the middle portion.

Figure 6B:
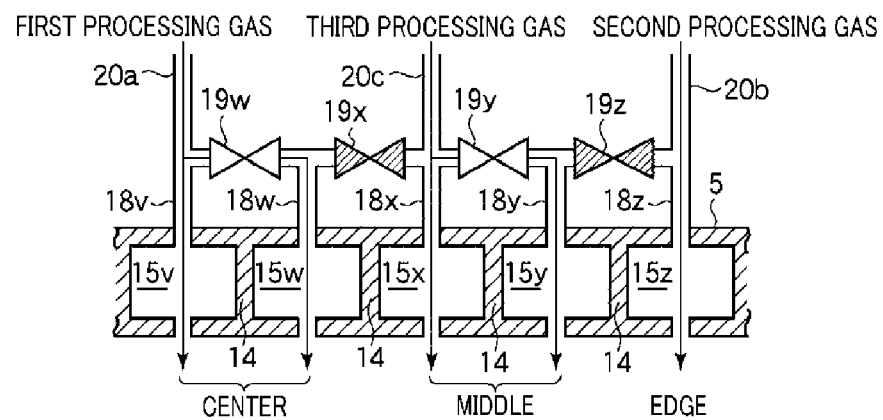

In the modification example, as illustrated in FIG. 6B, the valve 19x positioned at the edge portion from the space 15w among the third spaces and the valve 19z positioned at the edge portion from the space 15y are closed. In this case, the first processing gas is supplied from the first processing gas main supply pipe 20a into the space 15w through the valve 19w and the processing gas distribution pipe 18w. The first processing gas is discharged toward the central portion in the surface of the non-illustrated wafer W from the first space 15v and the space 15w. Likewise, the third processing gas is supplied from the third processing gas main supply pipe 20c into the space 15y through the valve 19y and the processing gas distribution pipe 18y. The third processing gas is discharged toward the middle portion in the surface of the wafer W from the spaces 15x and 15y. The second processing gas is discharged toward the edge portion in the surface of the wafer W from the second space 15z.

Figure 6C:
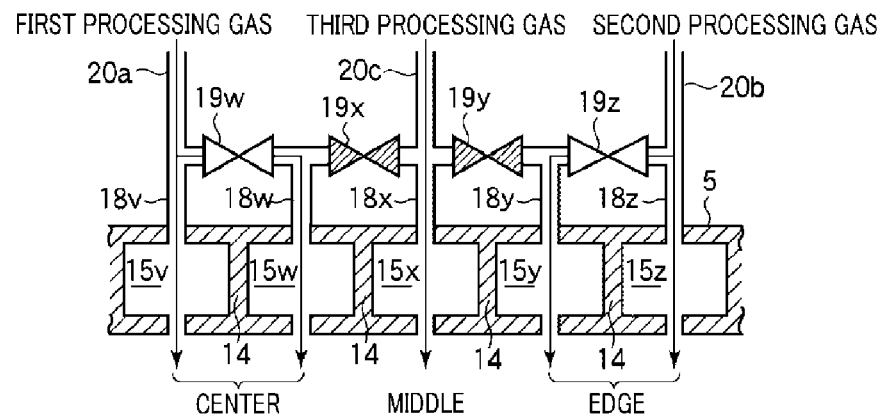

Moreover, as depicted in FIG. 6C, if the valve 19z is opened and the valve 19y is closed from the state shown in FIG. 6B, the second processing gas is supplied into the space 15y through the valve 19z and the processing gas distribution pipe 18y. Accordingly, the second processing gas is discharged toward the edge portion in the surface of the wafer W from the spaces 15z and 15y, and the third processing gas is discharged toward the middle portion in the surface of the wafer W from the space 15x.

Figure 6D:
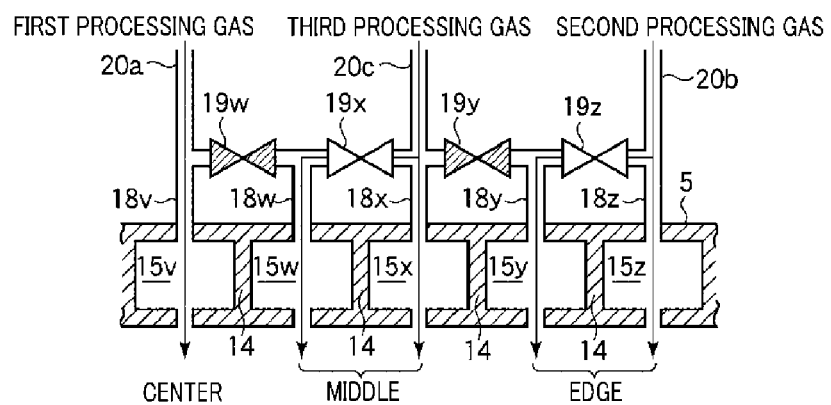

Further, as depicted in FIG. 6D, if the valve 19x is opened and the valve 19w is closed from the state shown in FIG. 6C, the third processing gas is supplied into the space 15w through the valve 19x and the processing gas distribution pipe 18w. Accordingly, the third processing gas is discharged toward the middle portion in the surface of the wafer W from the spaces 15w and 15x, and the first processing gas is discharged toward the central portion in the surface of the wafer W from the first space 15v.

Figure 6E:
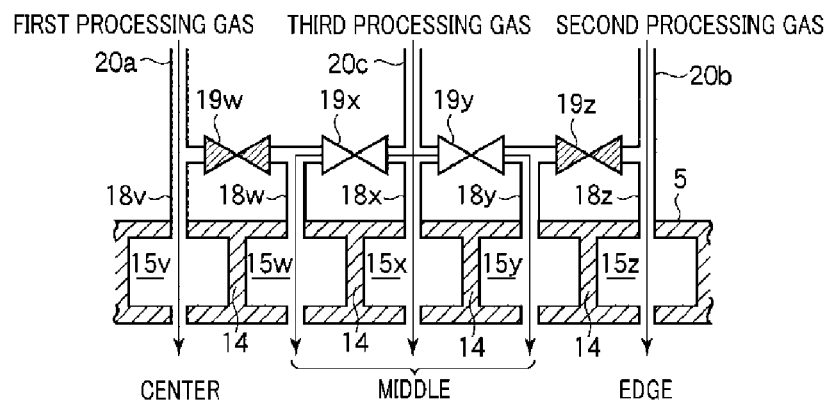

Moreover, as depicted in FIG. 6E, if the valve 19y is opened and the valve 19z is closed from the state shown in FIG. 6D, the third processing gas is supplied into the space 15y through the valve 19y and the processing gas distribution pipe 18y. Accordingly, the third processing gas is discharged toward the middle portion in the surface of the wafer W from the spaces 15w, 15x and 15y, and the second processing gas is discharged toward the edge portion in the surface of the wafer W from the space 15z.

As discussed above, the processing apparatus in accordance with the modification example is capable of changing discharging positions of three or more kinds of processing gases.

While the illustrative embodiment and the modification example have been described herein, the present disclosure is not limited thereto but can be realized in various other ways. The various aspects and embodiments disclosed herein are for the purposes of illustration and are not intended to be limiting.

By way of example, although the parallel plate type plasma processing apparatus is described as an example processing apparatus in the above-described illustrative embodiment, the processing apparatus may not be limited to the parallel plate type plasma processing apparatus. The illustrative embodiment may be applicable to any kind of processing apparatus as long as the processing apparatus is capable of changing at least one of a supply amount and a kind of a processing gas to be discharged to a processing target object, depending on a position in a surface of the processing target object. For example, the illustrative embodiment is also applicable to, e.g., a heat treating apparatus including a processing gas discharge unit that is provided within a processing chamber to face a mounting table for mounting thereon a processing target object and is configured to discharge the processing gas into the processing chamber. Besides, it shall be understood that the illustrative embodiment can be modified and embodied in various ways without changing technical conception and essential features of the illustrative embodiments, and all modifications and embodiments conceived from the meaning and scope of the claims and their equivalents are included in the scope of the disclosure.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing method performed by a substrate processing apparatus comprising
   a processing chamber for performing therein a process on a substrate,
   a mounting table provided within the processing chamber and configured to mount thereon the substrate,
   a processing gas discharge unit including a first space having a first discharge hole, a second space having a second discharge hole and at least one third space provided between the first space and the second space and having a third discharge hole, wherein the first space, the second space and the third space are partitioned by partition walls
   a first processing gas distribution pipe communicating with the first space,
   a second processing gas distribution pipe communicating with the second space,
   at least one third processing gas distribution pipe communicating with the least one third space,
   a first branch pipe connecting the first processing gas distribution pipe with the at least one third processing gas distribution pipe which is adjacent to the first processing gas distribution pipe,
   a second branch pipe connecting the second processing gas distribution pipe with the at least one third processing gas distribution pipe which is adjacent to the second processing gas distribution pipe,
   a first valve opened or closed to the first branch pipe,
   a second valve opened or closed to the second branch pipe,
   a first processing gas main supply pipe connected to the first processing gas distribution pipe,
   a second processing gas main supply pipe connected to the second processing gas distribution pipe,
   wherein the substrate processing method comprises:
   (a) closing one of the first valve and the second valve and opening another one of the first valve and the second valve,
   (b) supplying a first processing gas to the first processing gas main supply pipe and supplying a second processing gas to the second processing gas main supply pipe,
   (c) discharging the first processing gas to the processing chamber through the first discharge hole, discharging the second processing gas to the processing chamber through the second discharge hole and discharging one of the first processing gas and the second processing gas to the processing chamber through the third discharge hole,
   (d) opening the one which is closed at the step (a) and closing the other one which is opened at the step (a),
   (e) discharging the first processing gas to the processing chamber through the first discharge hole, discharging the second processing gas to the processing chamber through the second discharge hole and discharging another one of the first processing gas and the second processing gas, which is different from a processing gas discharged at the step (c), to the processing chamber through the third discharge hole,
   wherein the first processing gas and the second processing gas are different in at least one of a supply amount and a gas kind.

2. The substrate processing method of claim 1,
   wherein the first space corresponds to a central portion in a surface of the substrate, and the second space corresponds to an edge portion in the surface of substrate.

3. The substrate processing method of claim 1,
   in the step (a), opening the first valve and closing the second valve,
   in the step (c), discharging the first processing gas to the processing chamber through the third discharge hole, in the step (d), closing the first valve and opening the second valve, in the step (e), discharging the second processing gas to the processing chamber through the third discharge hole.

4. The substrate processing method of claim 1, in the step (a), closing the first valve and opening the second valve, in the step (c), discharging the second processing gas to the processing chamber through the third discharge hole, in the step (d), opening the first valve and closing the second valve, in the step (e), discharging the first processing gas to the processing chamber through the third discharge hole.

5. The substrate processing method of claim 1, wherein the step (d) is performed in a middle of the process on the substrate.

6. A substrate processing method performed by a substrate processing apparatus comprising a processing chamber for performing therein a process on a substrate, a mounting table provided within the processing chamber and configured to mount thereon the substrate, a processing gas discharge unit including a first space having a first discharge hole, a second space having a second discharge hole, a third space provided between the first space and the second space and having a third discharge hole, a fourth space provided between the first space and the third space and having a fourth discharge hole and a fifth space provided between the second space and the third space and having a fifth discharge hole, wherein the first space, the second space, the third space, fourth space and the fifth space are partitioned by partition walls a first processing gas distribution pipe communicating with the first space, a second processing gas distribution pipe communicating with the second space, a third processing gas distribution pipe communicating with the third space, a fourth processing gas distribution pipe communicating with the fourth space, a fifth processing gas distribution pipe communicating with the fifth space, a first branch pipe connecting the first processing gas distribution pipe with the fourth processing gas distribution pipe, a second branch pipe connecting the second processing gas distribution pipe with the fifth processing gas distribution pipe, a third branch pipe connecting the third processing gas distribution pipe with the fourth processing gas distribution pipe, a fourth branch pipe connecting the third processing gas distribution pipe with the fifth processing gas distribution pipe, a first valve opened or closed to the first branch pipe, a second valve opened or closed to the second branch pipe, a third valve opened or closed to the third branch pipe, a fourth valve opened or closed to the fourth branch pipe, a first processing gas main supply pipe connected to the first processing gas distribution pipe, a second processing gas main supply pipe connected to the second processing gas distribution pipe, a third processing gas main supply pipe connected to the third processing gas distribution pipe, wherein the substrate processing method comprises:

(a) opening one of the first valve and the third valve and closing another one of the first valve and the third valve, (b) opening one of the second valve and the fourth valve and closing another one of the second valve and the fourth valve, (c) supplying a first processing gas to the first processing gas main supply pipe, supplying a second processing gas to the second processing gas main supply pipe and supplying a third processing gas to the third processing gas main supply pipe, (d) discharging the first processing gas to the processing chamber through the first discharge hole, discharging the second processing gas to the processing chamber through the second discharge hole, discharging the third processing gas to the processing chamber through the third discharge hole, discharging one of the first processing gas and the third processing gas to the processing chamber through the fourth discharge hole and discharging one of the second processing gas and the third processing gas to the processing chamber through the fifth discharge hole, (e) opening the one which is closed at the step (a) and closing the other one which is opened at the step (a), or opening the one which is closed at the step (b) and closing the other one which is opened at the step (b), (f) discharging the first processing gas to the processing chamber through the first discharge hole, discharging the second processing gas to the processing chamber through the second discharge hole, discharging the third processing gas to the processing chamber through the third discharge hole and discharging one of the first processing gas, the second processing gas and the third processing gas, which is different from a processing gas discharged at the step (d), to the processing chamber through the fourth discharge hole or the fifth discharge hole, respectively, and wherein the first processing gas, the second processing gas and the third processing gas are different in at least one of a supply amount and a gas kind.

7. The substrate processing method of claim 6, in the step (e), opening the one which is closed at the step (a) and closing the other one which is opened at the step (a), and opening the one which is closed at the step (b) and closing the other one which is opened at the step (b), in the step (f), discharging one of the first processing gas, the second processing gas and the third processing gas, which is different from a processing gas discharged at the step (d), to the processing chamber through the fourth discharge hole and the fifth discharge hole, respectively.

8. The substrate processing method of claim 7, in the step (a), closing the first valve and opening the third valve, in the step (b), closing the second valve and opening the fourth valve, in the step (d), discharging the third processing gas to the processing chamber through the fourth discharge hole and the fifth discharge hole, in the step (e), opening the first valve and the second valve and closing the third valve and the fourth valve, in the step (f), discharging the first processing gas to the processing chamber through the fourth discharge hole and discharging the second processing gas to the processing chamber through the fifth discharge hole.

9. The substrate processing method of claim 7,
in the step (a), opening the first valve and closing the third valve,
in the step (b), opening the second valve and closing the fourth valve,
in the step (d), discharging the first processing gas to the processing chamber through the fourth discharge hole and discharging the second processing gas to the processing chamber through the fifth discharge hole,
in the step (e), opening the third valve and the fourth valve and closing the first valve and the second valve,
in the step (f), discharging the third processing gas to the processing chamber through the fourth discharge hole and the fifth discharge hole.

10. The substrate processing method of claim 7,
in the step (a), opening the third valve and closing the first valve,
in the step (b), opening the second valve and closing the fourth valve,
in the step (d), discharging the third processing gas to the processing chamber through the fourth discharge hole and discharging the second processing gas to the processing chamber through the fifth discharge hole,
in the step (e), opening the first valve and the fourth valve and closing the second valve and the third valve,
in the step (f), discharging the first processing gas to the processing chamber through the fourth discharge hole and discharging the third processing gas to the processing chamber through the fifth discharge hole.

11. The substrate processing method of claim 7,
in the step (a), opening the first valve and closing the third valve,
in the step (b), opening the fourth valve and closing the second valve,
in the step (d), discharging the first processing gas to the processing chamber through the fourth discharge hole and discharging the third processing gas to the processing chamber through the fifth discharge hole,
in the step (e), opening the second valve and the third valve and closing the first valve and the fourth valve,
in the step (f), discharging the third processing gas to the processing chamber through the fourth discharge hole and discharging the second processing gas to the processing chamber through the fifth discharge hole.

12. The substrate processing method of claim 6,
in the step (a), opening the third valve and closing the first valve,
in the step (b), opening the fourth valve and closing the second valve,
in the step (d), discharging the third processing gas to the processing chamber through the fourth discharge hole and the fifth discharge hole,
in the step (e), opening the first valve and closing the third valve,
in the step (f), discharging the first processing gas to the processing chamber through the fourth discharge hole and discharging the third processing gas to the processing chamber through the fifth discharge hole.

13. The substrate processing method of claim 6,
in the step (a), closing the first valve and opening the third valve,
in the step (b), closing the second valve and opening the fourth valve,
in the step (d), discharging the third processing gas to the processing chamber through the fourth discharge hole and the fifth discharge hole,
in the step (e), opening the second valve and closing the fourth valve,
in the step (f), discharging the third processing gas to the processing chamber through the fourth discharge hole and discharging the second processing gas to the processing chamber through the fifth discharge hole.

14. The substrate processing method of claim 6,
in the step (a), opening the first valve and closing the third valve,
in the step (b), opening the fourth valve and closing the second valve,
in the step (d), discharging the first processing gas to the processing chamber through the fourth discharge hole and discharging the third processing gas to the processing chamber through the fifth discharge hole,
in the step (e), opening the second valve and closing the fourth valve,
in the step (f), discharging the first processing gas to the processing chamber through the fourth discharge hole and discharging the second processing gas to the processing chamber through the fifth discharge hole.

15. The substrate processing method of claim 6,
in the step (a), opening the first valve and closing the third valve,
in the step (b), opening the fourth valve and closing the second valve,
in the step (d), discharging the first processing gas to the processing chamber through the fourth discharge hole and discharging the third processing gas to the processing chamber through the fifth discharge hole,
in the step (e), opening the third valve and closing the first valve,
in the step (f), discharging the third processing gas to the processing chamber through the fourth discharge hole and discharging the third processing gas to the processing chamber through the fifth discharge hole.

16. The substrate processing method of claim 6,
in the step (a), opening the first valve and closing the third valve,
in the step (b), opening the second valve and closing the fourth valve,
in the step (d), discharging the first processing gas to the processing chamber through the fourth discharge hole and discharging the second processing gas to the processing chamber through the fifth discharge hole,
in the step (e), opening the third valve and closing the first valve,
in the step (f), discharging the third processing gas to the processing chamber through the fourth discharge hole and discharging the second processing gas to the processing chamber through the fifth discharge hole.

17. The substrate processing method of claim 6,
in the step (a), opening the first valve and closing the third valve,
in the step (b), opening the second valve and closing the fourth valve,
in the step (d), discharging the first processing gas to the processing chamber through the fourth discharge hole and discharging the second processing gas to the processing chamber through the fifth discharge hole,
in the step (e), opening the fourth valve and closing the second valve,
in the step (f), discharging the first processing gas to the processing chamber through the fourth discharge hole and discharging the third processing gas to the processing chamber through the fifth discharge hole.

18. The substrate processing method of claim 6,
in the step (a), closing the first valve and opening the third valve,
in the step (b), opening the second valve and closing the fourth valve,
in the step (d), discharging the third processing gas to the processing chamber through the fourth discharge hole and discharging the second processing gas to the processing chamber through the fifth discharge hole,
in the step (e), closing the second valve and opening the fourth valve,
in the step (f), discharging the third processing gas to the processing chamber through the fourth discharge hole and discharging the third processing gas to the processing chamber through the fifth discharge hole.

19. The substrate processing method of claim 6,
in the step (a), closing the first valve and opening the third valve,
in the step (b), opening the second valve and closing the fourth valve,
in the step (d), discharging the third processing gas to the processing chamber through the fourth discharge hole and discharging the second processing gas to the processing chamber through the fifth discharge hole,
in the step (e), opening the first valve and closing the third valve,
in the step (f), discharging the first processing gas to the processing chamber through the fourth discharge hole and discharging the second processing gas to the processing chamber through the fifth discharge hole.

* * * * *